(12) United States Patent
Tanaka

(10) Patent No.: US 7,863,191 B2
(45) Date of Patent: Jan. 4, 2011

(54) MANUFACTURING METHOD OF SEMICONDUCTOR DEVICE

(75) Inventor: Kenji Tanaka, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 151 days.

(21) Appl. No.: 11/860,579

(22) Filed: Sep. 25, 2007

(65) Prior Publication Data
US 2008/0081472 A1 Apr. 3, 2008

(30) Foreign Application Priority Data
Sep. 28, 2006 (JP) .............................. 2006-264221

(51) Int. Cl.
*H01L 21/44* (2006.01)
(52) U.S. Cl. ................... 438/682; 438/664; 438/651; 257/757; 257/E21.164; 257/E29.116
(58) Field of Classification Search ............... 438/682, 438/240, 704, 400, 624; 257/327, 382
See application file for complete search history.

(56) References Cited

U.S. PATENT DOCUMENTS

| 6,066,563 A * | 5/2000 | Nagashima | 438/692 |
| 6,888,198 B1 * | 5/2005 | Krivokapic | 257/347 |
| 2002/0182798 A1 * | 12/2002 | Saito et al. | 438/211 |
| 2003/0042535 A1 * | 3/2003 | Saito et al. | 257/327 |
| 2005/0202655 A1 * | 9/2005 | Sakamoto | 438/491 |
| 2008/0076246 A1 * | 3/2008 | Peterson et al. | 438/655 |

FOREIGN PATENT DOCUMENTS

| JP | 2000-332105 | 11/2000 |
| JP | 2001-110748 | 4/2001 |
| JP | 2002-75905 | 3/2002 |
| JP | 2003-234307 | 8/2003 |

OTHER PUBLICATIONS

Japanese Patent Office issued a Japanese Office Action dated Apr. 30, 2009, Application No. 2006-264221.

* cited by examiner

*Primary Examiner*—Fernando L Toledo
*Assistant Examiner*—Mamadou Diallo
(74) *Attorney, Agent, or Firm*—Young & Thompson

(57) ABSTRACT

A first structure is formed, having a contact plug formed on the bottom of a first opening in an interlayer insulating film, a second opening formed through the interlayer insulating film to reach a semiconductor substrate, and a third opening formed through the interlayer insulating film to reach a polymetal gate electrode. A cobalt layer is deposited on the surface of the structure, and thermally treated to form a cobalt silicide layer on the surface of the contact plug and on the bottom face of the second opening. The structure is then treated to remove the cobalt, in the state in which the cobalt silicide layer is formed, with the use of a chemical solution capable of dissolving cobalt but not the polymetal.

12 Claims, 10 Drawing Sheets

MANUFACTURING METHOD OF SEMICONDUCTOR DEVICE

This application is based upon and claims the benefit of priority from Japanese patent application No. 2006-264221 filed on Sep. 28, 2006, the disclosure of which is incorporated herein in its entirety by reference.

BACKGROUND OF THE INVENTION

1. Field of the Invention

The present invention relates to a manufacturing method of a semiconductor device, and in particular to a resistance reduction process for a semiconductor device such as a DRAM device.

2. Description of the Related Art

In order to speed up a logic device or a device having DRAM and a logic circuit incorporated therein, it is necessary to reduce the resistance by a silicide process at the connection points where metal wiring is connected to a source electrode, drain electrode, gate electrode, and polysilicon contact. For this purpose, a cobalt silicide technology is typically utilized from the viewpoint of a wiring thinning effect or heat resistance (e.g. Japanese Laid-Open Patent Publication No. 2002-75905 (Patent Document 1)).

According to Patent Document 1, formation of cobalt silicide is achieved by depositing cobalt on source and drain regions, which are exposed from an insulating film selectively formed on a semiconductor substrate, on a silicon gate electrode formed over a portion of the semiconductor substrate, and on the insulating film, and then forming a cobalt silicide film by heat treatment on the source and drain regions and the silicon gate electrode. Any cobalt remaining unreacted is removed by an etchant consisting of aqueous solution of mixture of hydrochloric acid, hydrogen peroxide and water. Source and drain electrodes and gate electrode are thus formed with their resistance reduced in a self-alignment manner.

On the other hand, for the purpose of reducing the resistance of a gate electrode, it has become mainstream to utilize a gate electrode having a polymetal structure (polymetal gate) in which a metal film having a high melting point and low resistance is stacked on a polysilicon film. In particular, the use of a tungsten polymetal gate formed of a tungsten film is becoming mainstream. Since tungsten is dissolved by a chemical solution having hydrogen peroxide solution mixed therein, the silicide process cannot be performed by using the tungsten polymetal gate in the method as described in Patent Document 1. Accordingly, APM solution (mixture of ammonia water, hydrogen peroxide solution and water, "APM" standing for ammonium hydroxide-hydrogen peroxide-mixture) or SPM solution (mixture of sulfuric acid, hydrogen peroxide solution and water, "SPM" standing for sulfuric acid-hydrogen peroxide-mixture) which is normally used in a cleaning process for a semiconductor device cannot be used in a state where the tungsten polymetal gate is exposed. Therefore, an additional process is required to protect the tungsten gate wiring before performing the silicide process, resulting in increase of the number of photolithography steps.

These problems will be described with reference to FIG. 1 which is a cross-sectional view showing part of a cell formation region (the left side) and a peripheral circuit formation region (right side) in a DRAM device fabricating process. Although in the cell formation region, another region is formed on the left of the leftmost line, symmetrical to the region indicated on the right of the leftmost line, this symmetrical region is omitted from FIG. 1. FIG. 1 shows a state in which a first opening 41 and a second opening 43 are formed in a laminated structure having various types of films and a gate electrode formed over a substrate. Processes to form such a structure will be described so far as the present invention is concerned. A substrate 10 has an element isolation region 11 formed of an oxide film, an active region (not shown) and so on. There are formed on this substrate 11, a gate insulating film (silicon oxide film) (not shown), a polysilicon film, a tungsten nitride film (not shown), a tungsten film, and a silicon nitride film. A resist pattern (not shown) is formed in a predetermined region where a gate electrode is to be formed. Using this resist pattern as a mask, the silicon nitride film is etched to form a gate cap 23. After removing the resist pattern, the gate cap 23 is used as a mask to etch away the tungsten film and the tungsten nitride film, and to form a tungsten polymetal gate composed of a tungsten film 22, a tungsten nitride film (not shown), and a polysilicon gate 21.

Subsequently, a silicon nitride film is formed and anisotropically etched back to form gate side wall 24. Photolithography process and ion implantation are then performed to form an $N^+$ diffusion layer or a $P^+$ diffusion layer in the substrate, and a source region and a drain region are formed. Further, an oxide film 35 to be a first interlayer insulating film is formed on the entire surface, and then a contact hole is formed therein. The contact hole is filled with polysilicon, forming a contact plug 32. Subsequently, a second interlayer insulating film 37 is stacked thereon. A first opening (first contact hole) 41 and second opening (second contact hole) 43 are formed through the second interlayer insulating film. The first opening (first contact hole) 41 has such a depth that the top face of the contact plug 32 is exposed. The second opening (second contact hole) 43 extends also through the first interlayer insulating film, having such a depth as to reach the substrate in the peripheral circuit formation region. FIG. 1 shows a structure obtained by the method as described above.

In a state in which the first opening 41 and the second opening 43 are formed as shown in FIG. 1, a cobalt film 51 is formed by sputtering as shown in FIG. 2.

The structure is then thermally treated in an inert gas atmosphere at a temperature of 500° C. or higher to form a cobalt silicide layer 52 on the surface of the contact plug 32 in the first opening 41 and on the surface of the substrate 10 in the second opening 43, as shown in FIG. 3.

Subsequently, any unreacted cobalt which has been left unsilicidized on the interlayer insulating film or the like is removed. According to the related art, the removal of the cobalt is performed by using SPM (mixed solution of sulfuric acid and hydrogen peroxide) or other chemical solutions having hydrogen peroxide solution mixed therein, so that a structure having a silicidized cobalt film as shown in FIG. 4 is obtained.

FIG. 4 shows a structure in which the surface of the contact plug and a region where wiring on the semiconductor substrate is connected are silicidized. A resist pattern (not shown) is formed and the oxide film 37 and the oxide film 35 are dry etched by using the resist pattern as a mask. Further, the nitride film forming the cap layer and another nitride film thereon are etched, whereby a contact hole 42 is formed to reach the tungsten polymetal gate (21, 22) in the peripheral circuit formation region. FIG. 5 shows the state in which the contact hole 42 has been formed in this manner.

In the state shown in FIG. 5, therefore, the first contact hole is formed through the second interlayer insulating film 37, and a silicide film 52 is formed on the contact plug 32 in the bottom of the first contact hole. A second contact hole is formed through the first interlayer insulating film 35 and the second interlayer insulating film 37, and a silicide film 52 is formed on the surface of the semiconductor substrate in the bottom of the second contact hole. A third contact hole is formed through the second interlayer insulating film 37 and the first interlayer insulating film 35 in the peripheral circuit formation region to such a depth as to reach the tungsten film of the tungsten polymetal gate.

Subsequently, a metal film (tungsten) for forming wiring is formed in the holes of the structure shown in FIG. 5 by a CVD process. After polishing off any excessive tungsten by a CMP process, a metal film (tungsten) for forming wiring is formed. As a result, as shown in FIG. 6, a contact 63 is formed in each of the first, second and third contact holes while, at the same time, a metal film 64 is formed on the entire surface. The metal wiring is then patterned to form wiring. Additionally, a cell storage capacitor and so on are formed.

SUMMARY OF THE INVENTION

According to the related art as described above, it is impossible, in the case of a semiconductor device having a tungsten polymetal gate structure, to form a contact hole reaching the gate wiring prior to the removal of unsilicidized cobalt. It is therefore inevitably necessary to form the openings in a separate step after the removal step. Due to this restriction, it is always required to prepare a plurality of masks and to perform additional steps for forming the openings. This makes the processing procedures complicated and increases the number of required masks, inducing a problem of difficulty in cost reduction.

It is therefore an object of the present invention to provide a manufacturing method of a semiconductor device having a tungsten polymetal gate electrode structure and having a silicide film on the semiconductor substrate or on the surface of a contact plug, the manufacturing method being capable of simplifying the process of wiring to the gate electrode structure and to the silicide film in the contact hole without giving any damage to the tungsten polymetal gate electrode.

According to the present invention, there is provided a manufacturing method of a semiconductor device having a silicide film. The method includes: a first step of forming a first structure having a first opening formed through an interlayer insulating film to reach a contact plug, a second opening formed through the interlayer insulating film to reach a semiconductor substrate, and a third opening formed through the interlayer insulating film to reach a polymetal gate electrode; a second step of depositing a cobalt (Co) layer on the surface of the first structure; a third step of performing heat treatment to form a cobalt silicide layer on the surface of the contact plug and on the surface of the semiconductor substrate; and a fourth step of removing unreacted cobalt (Co), in the state where the cobalt silicide layer is formed, with the use of a chemical solution capable of dissolving cobalt (Co) but not the polymetal.

A metal film for preventing oxidation of cobalt (Co) may be formed on the cobalt (Co) layer subsequent to the second step, and, after performing the third step, the metal film may be removed by treating with a chemical solution prior to the fourth step.

The surface of the gate electrode is formed of tungsten (W).

The chemical solution for dissolving cobalt (Co) is a chemical solution having no oxidation effect.

The chemical solution for dissolving cobalt is a solution principally composed of sulfuric acid.

The chemical solution for dissolving cobalt may be a mixed solution of hydrochloric acid and water.

According to the present invention, the use of a solution capable of dissolving cobalt but not tungsten makes it possible to form a plurality of contact holes reaching the metal gate wiring, the substrate, the plug and so on simultaneously by a single lithography process, and hence makes it possible to reduce the number of masks and the number of process steps.

DESCRIPTION OF THE EXEMPLARY EMBODIMENT

The present invention will be described with reference to the accompanying drawings.

FIGS. 7 to 10 are cross-sectional views showing a exemplary embodiment of the present invention. These figures show part of a memory cell formation region (left side) and part of a peripheral circuit formation region (right) in respective steps of a DRAM device manufacturing process. Specifically, the left side of each of the drawings shows a region of a memory cell where a capacitance structure is formed later to store information. The right side shows a region to be a circuitry to control the read and write of information in the memory cell for each bit (for each "0" or "1" data).

Figure 7:
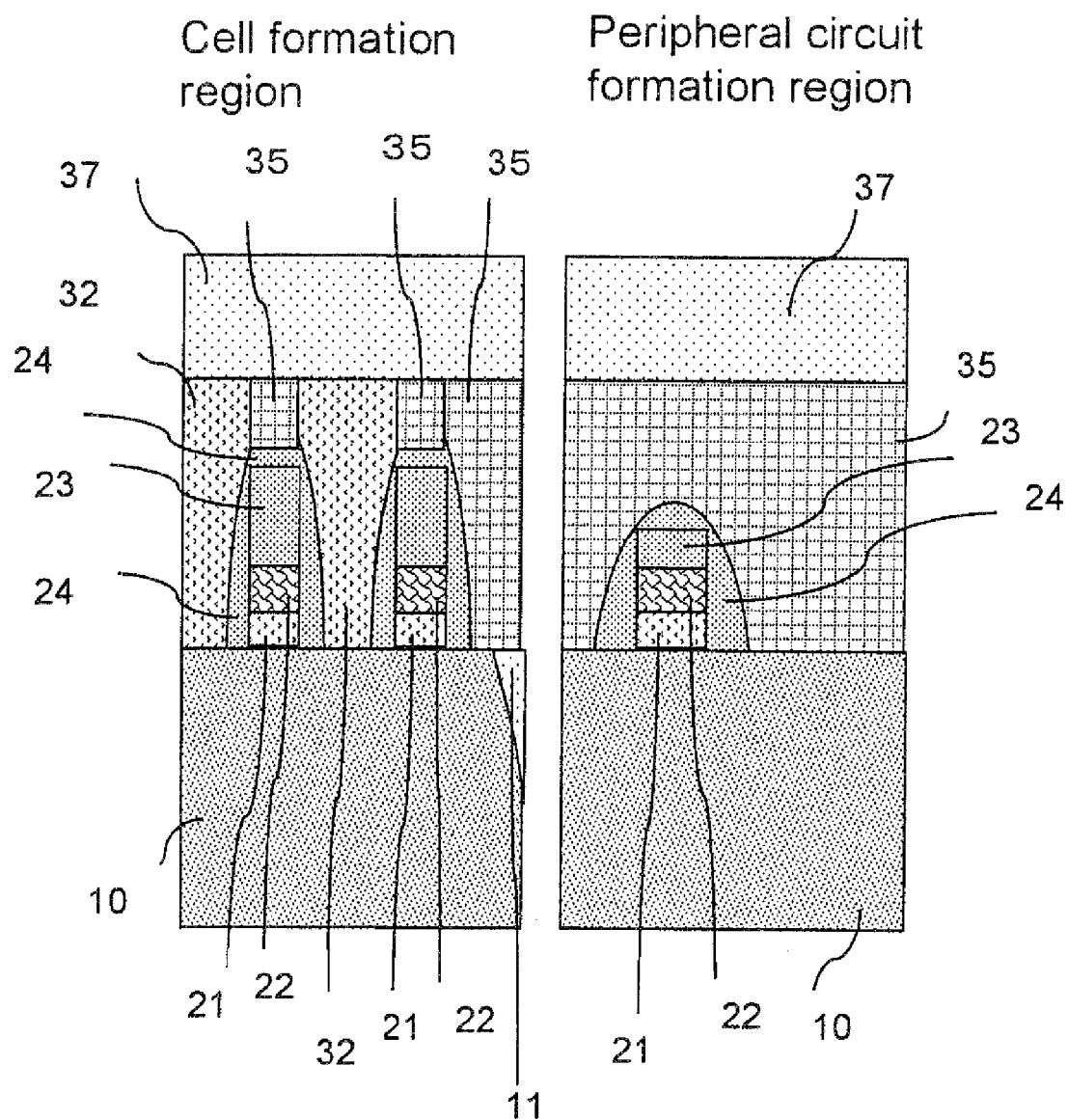
FIG. 7 is a cross-sectional view showing a laminated structure before formation of openings used in an exemplary embodiment of the invention.

FIG. 7 shows a structure, to which the exemplary embodiment is to be applied, and which has not been formed with openings yet. Prior to formation of the structure, a laminated structure is prepared which includes a gate insulating film (silicon oxide film) (not shown), a polysilicon film, tungsten nitride (not shown), a tungsten film, and a silicon nitride film which are formed over a substrate 10. The substrate has been formed with an element isolation region 11, an active region (not shown) and so on. The structure of FIG. 7 is formed in the following way: over the laminated structure, a resist pattern (not shown) is formed in a region where a gate electrode is to be formed, and the silicon nitride film is etched with the resist pattern used as a mask to form a gate cap 23 in the cell formation region (left side) and in the peripheral circuit formation region (right side). After removal of the resist pattern, the tungsten film and the tungsten nitride film are etched away with the gate cap 23 used as a mask, so that a tungsten polymetal gate electrode comprised of a tungsten film 22, a tungsten nitride film (not shown), and a polysilicon 21 is formed.

Subsequently, a silicon nitride film is formed and then anisotropically etched back to form a gate side wall 24. The side wall adjusts the implantation area during ion implantation to the substrate. Photolithography process and ion implantation process are performed to form an $N^+$ diffusion layer or a $P^+$ diffusion layer in the substrate for a drain region and source region. Further, an oxide film 35 to be a first interlayer insulating film is formed on the entire surface. A contact hole is formed in the first interlayer insulating film, and the contact hole is filled with polysilicon to form a contact plug 32. Subsequently, a second interlayer insulating film 37 is formed. The structure thus obtained is shown in FIG. 7.

Figure 8:
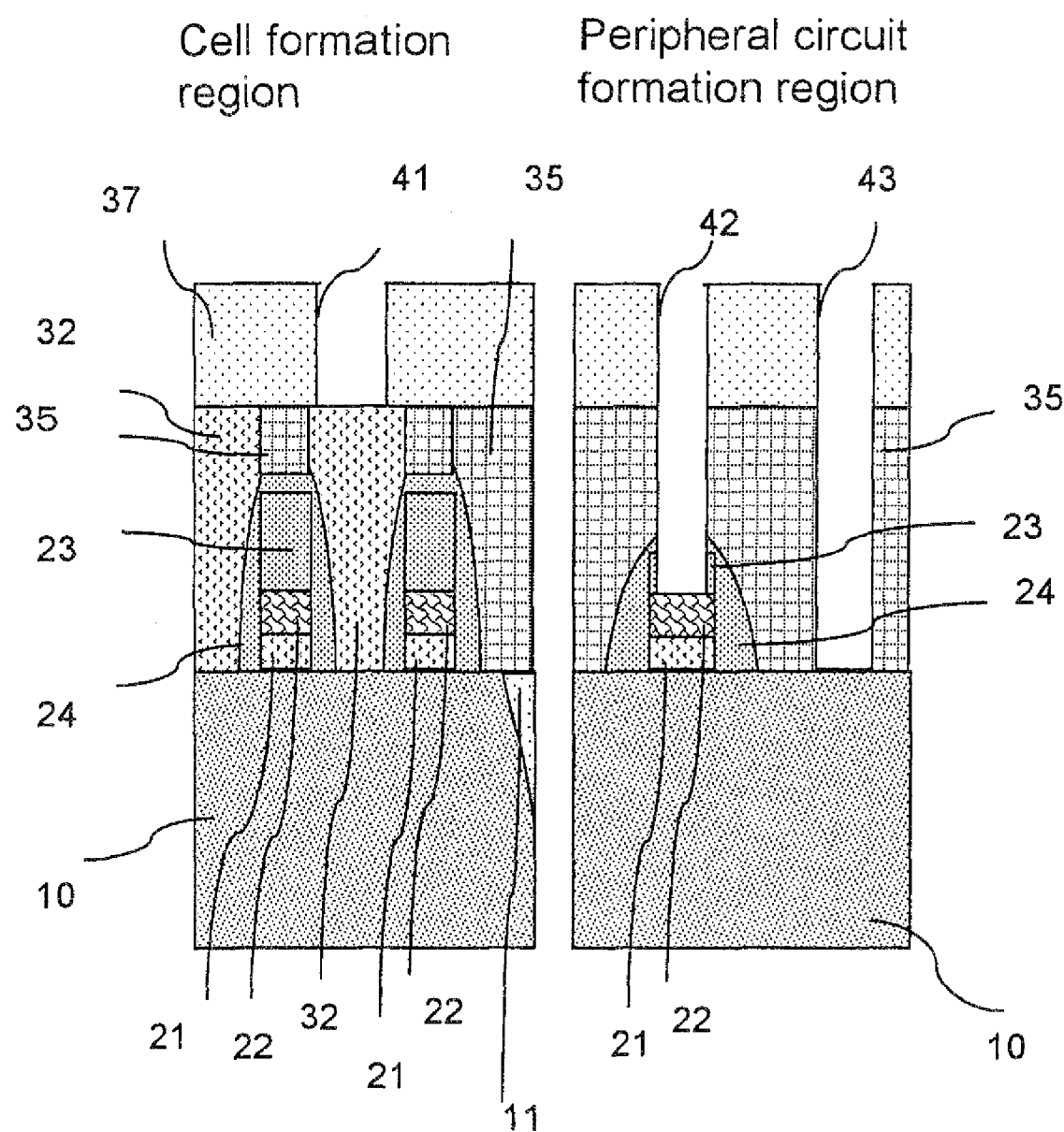
FIG. 8 is a cross-sectional view showing a state in which three types of openings have been formed in the laminated structure of FIG. 7 according to the exemplary embodiment of the present invention.

A first opening, a second opening, and a third opening are formed in the structure of FIG. 7, producing a structure as shown in FIG. 8. In FIG. 8, the first opening (first contact hole) 41 is formed through the second interlayer insulating film 37, the second opening (second contact hole) 43 is formed through the second interlayer insulating film 37 and the first interlayer insulating film 35, and the third opening (third contact hole) 42 is formed through the second interlayer insulating film 37, the first interlayer insulating film 35, the side-wall silicon nitride film and the silicon nitride film 23. The first opening 41 has such a depth as to expose the upper face of the contact plug 32. The second opening 43 has such a depth as to extend through the first interlayer insulating film 35 as well and to reach the substrate 10 in the peripheral circuit formation region. The third opening 42 has such a depth as to reach the tungsten film 22 of the polymetal gate electrode. The openings are thus formed on the contact plug 32, the tungsten film 22 of the gate electrode, and the substrate 10, respectively. Therefore, different materials are exposed in the bottoms of the respective openings. Specifically, polysilicon is exposed in the first opening 41, tungsten is exposed in the second opening, and monocrystalline silicon is exposed in the third opening 42.

A cobalt film 51 is then formed on the entire surface of the structure as shown in FIG. 8, in which the first opening 41, the second opening 43 and the third opening 42 have been formed.

Figure 9:
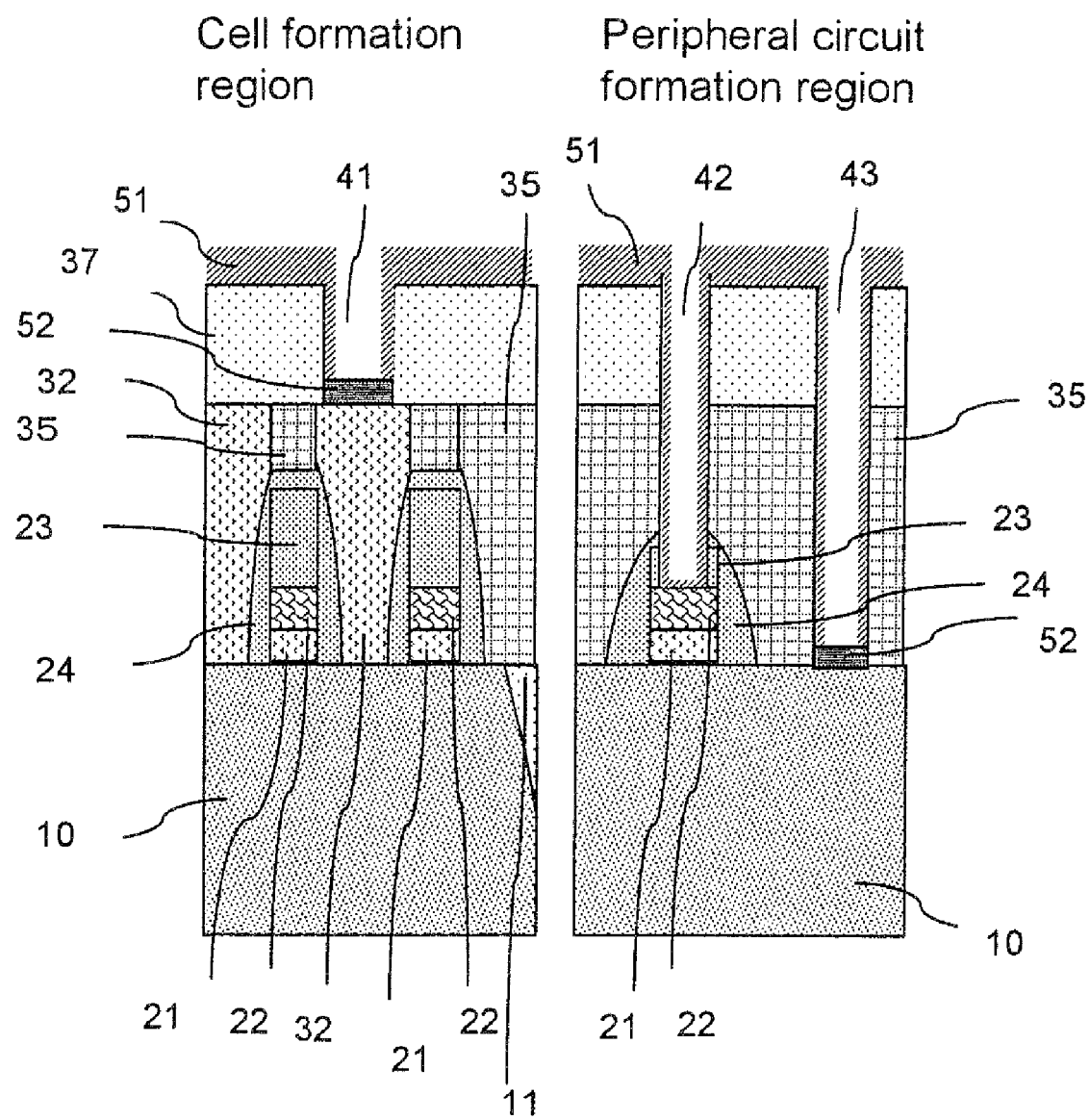
FIG. 9 is a cross-sectional view showing a state in which a cobalt film has been formed and silicidized on the entire surface of the structure of FIG. 8 according to the exemplary embodiment of the present invention.

The structure is then heat treated in an inert gas atmosphere at a temperature of 500° C. or higher to form a cobalt silicide ($CoSi_2$) layer 52 on the surface of the contact plug 32 within the first opening 41, and on the surface of the silicon substrate 10 within the second opening 43, as shown in FIG. 9 (the substrate surface regions corresponding thereto have previously been treated to form a source region or a drain region). On the other hand, the gate electrode, which is formed by a polymetal structure, is not formed with a cobalt silicide ($CoSi_2$) while cobalt (Co) is left unreacted. In the same manner, cobalt (Co) is left unreacted on the surface of the interlayer insulating film 37.

Figure 10:
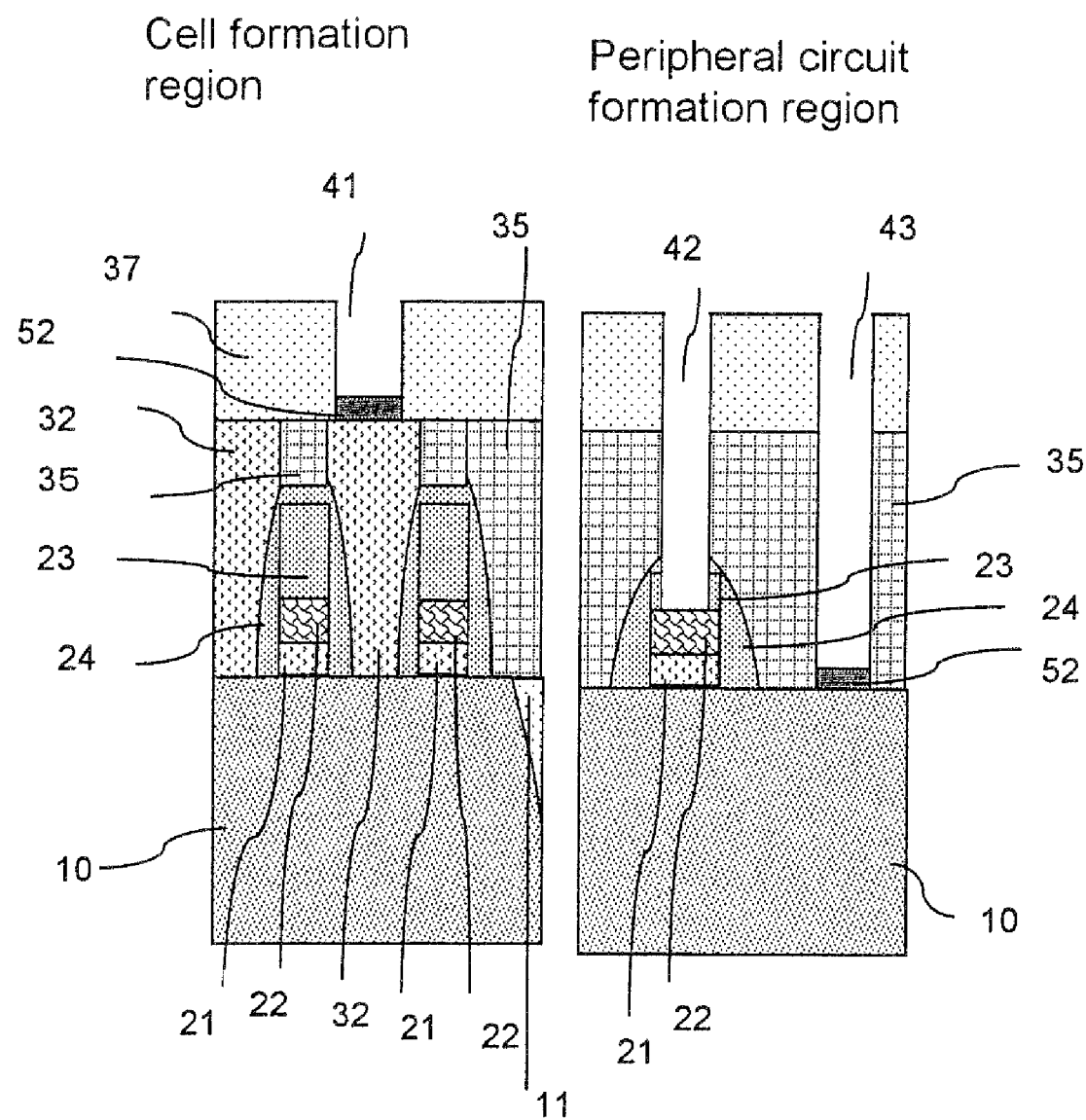
FIG. 10 is a cross-sectional view showing a state in which unreacted cobalt has been removed by treatment with a chemical solution from the structure of FIG. 9 according to the exemplary embodiment of the present invention.

The unreacted cobalt is removed by a wet process using sulfuric acid or the like. This sulfuric acid solution is not mixed with any chemical solution which may possibly act as an oxidizing agent such as hydrogen peroxide solution. The use of such sulfuric acid solution makes it possible to remove only the unreacted cobalt without dissolving the gate wiring material metal. For example, 70 to 90% sulfuric acid is used for this purpose. Hydrochloric acid may be used instead of sulfuric acid. In this case as well, the chemical solution should not be mixed with any oxidizing agent such as hydrogen peroxide solution. The hydrochloric acid is for example mixed with water to form 10 to 30% hydrochloric acid solution. After the silicidization of the required regions and the removal of the unreacted cobalt in this manner, another heat treatment is performed since there is a possibility that the first heat treatment was not enough for thorough silicidization. FIG. 10 shows a thoroughly silicidized state of the structure thus obtained.

According to the present invention, the first opening 41, the second opening 43, and the third opening 42 are formed by the same opening formation process. After formation of the cobalt film and silicidization thereof, the treatment is performed by using a chemical solution principally composed of sulfuric acid or hydrochloric acid and not containing any oxidizing agent such as hydrogen peroxide. In this manner, any unreacted cobalt can be removed without dissolving the tungsten film serving as a metal wiring of the polymetal gate.

Figure 1:
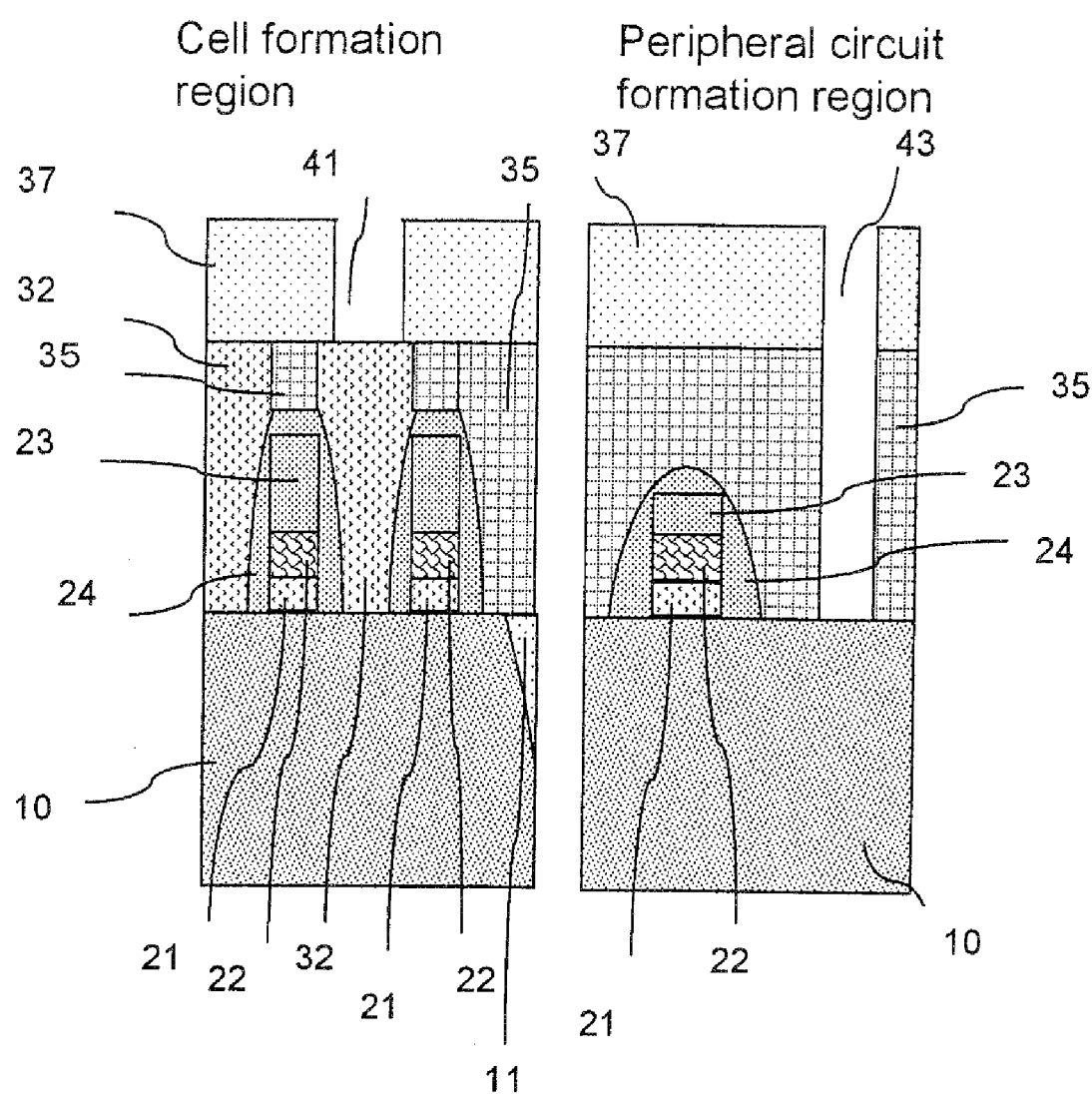
FIG. 1 is a cross-sectional view showing a state in which a first opening and a second opening have been formed in an interlayer insulating film according to a related art manufacturing method of a semiconductor device.
Figure 2:
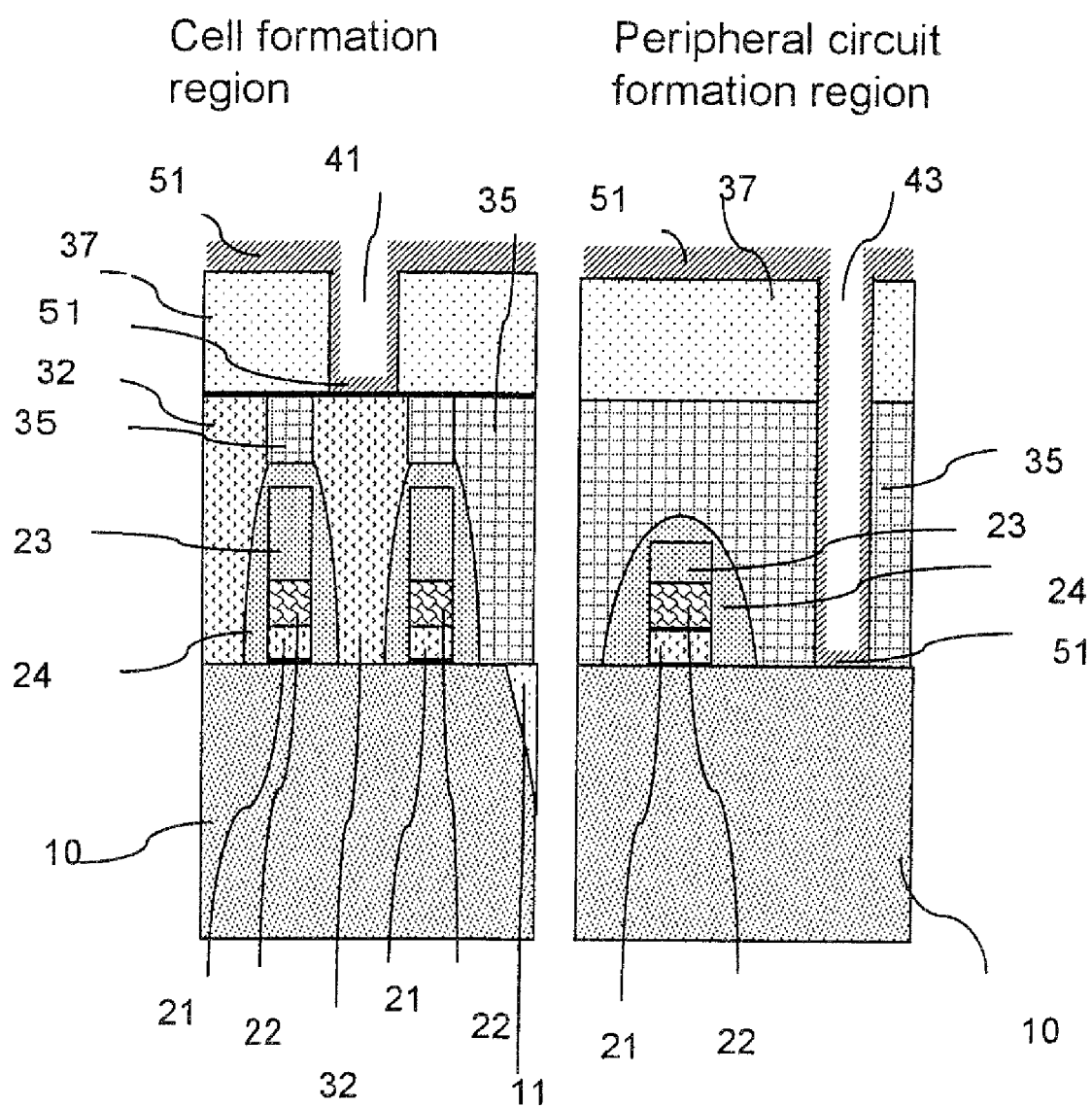
FIG. 2 is a cross-sectional view showing a state in which a cobalt film has been formed on the structure shown in FIG. 1 according to the related art manufacturing method of a semiconductor device.
Figure 3:
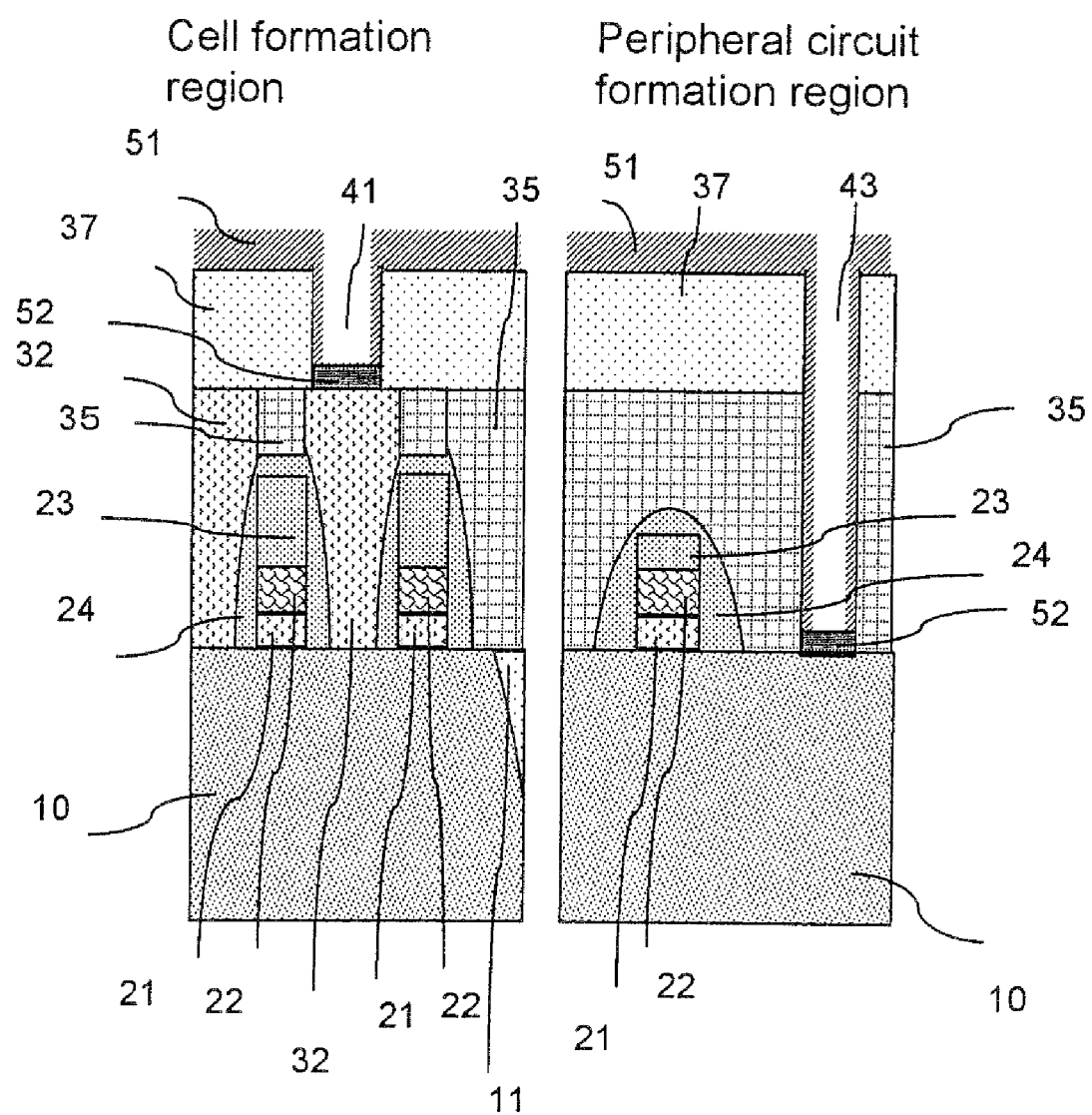
FIG. 3 is a cross-sectional view showing a state in which the cobalt film in FIG. 2 has been silicidized by heat treatment according to the related art manufacturing method of a semiconductor device.
Figure 4:
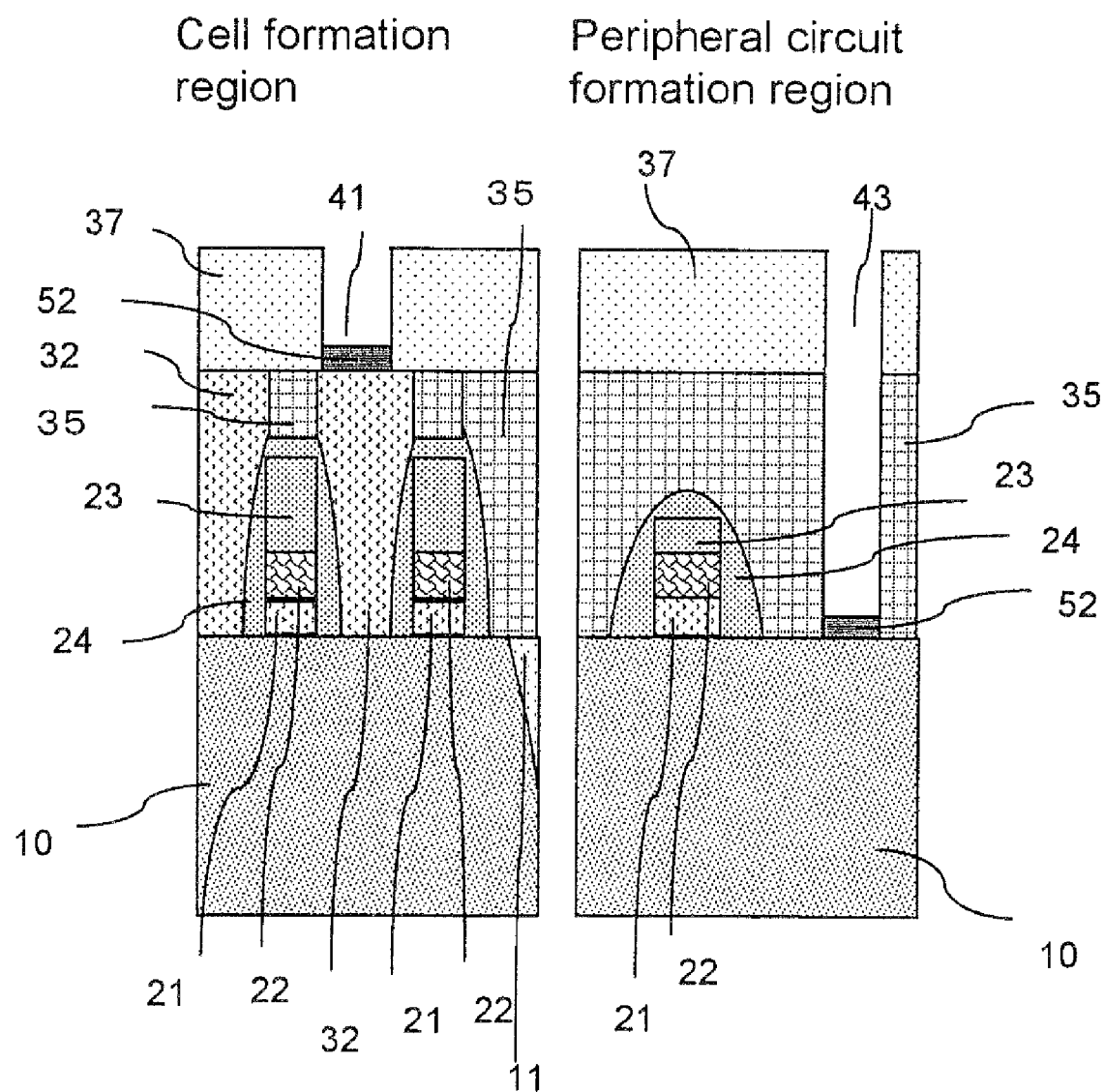
FIG. 4 is a cross-sectional view showing a state in which unreacted cobalt has been removed with a chemical solution containing hydrogen peroxide from the structure of FIG. 3 according to the related art manufacturing method of a semiconductor device.
Figure 5:
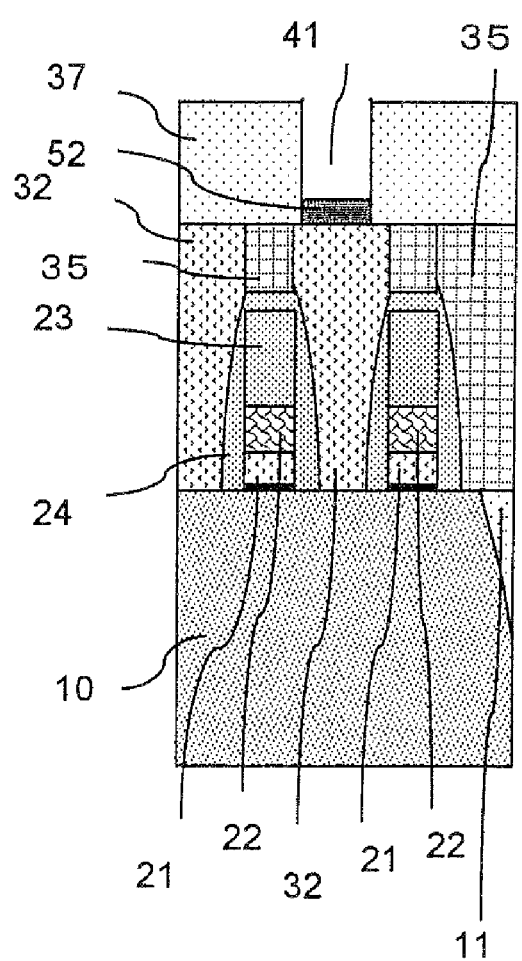
FIG. 5 is a cross-sectional view showing a state in which a third opening has been formed in the structure of FIG. 4 according to the related art manufacturing method of a semiconductor device.
Figure 5:
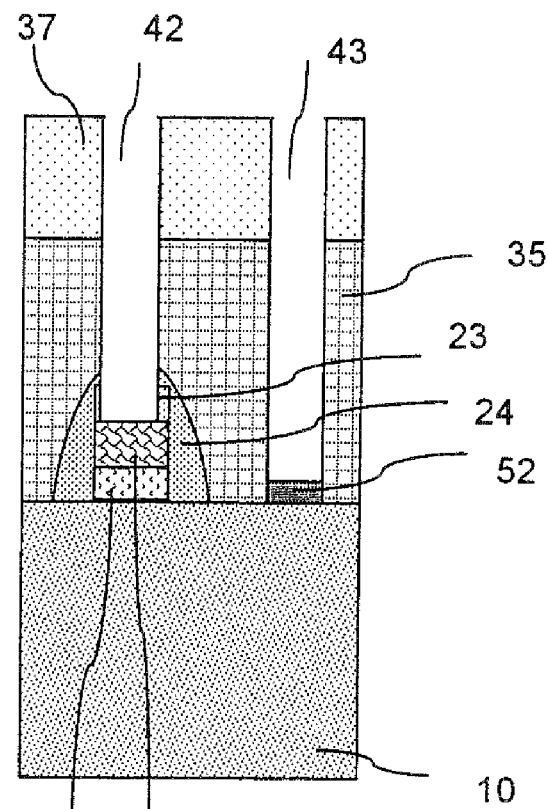
Figure 6:
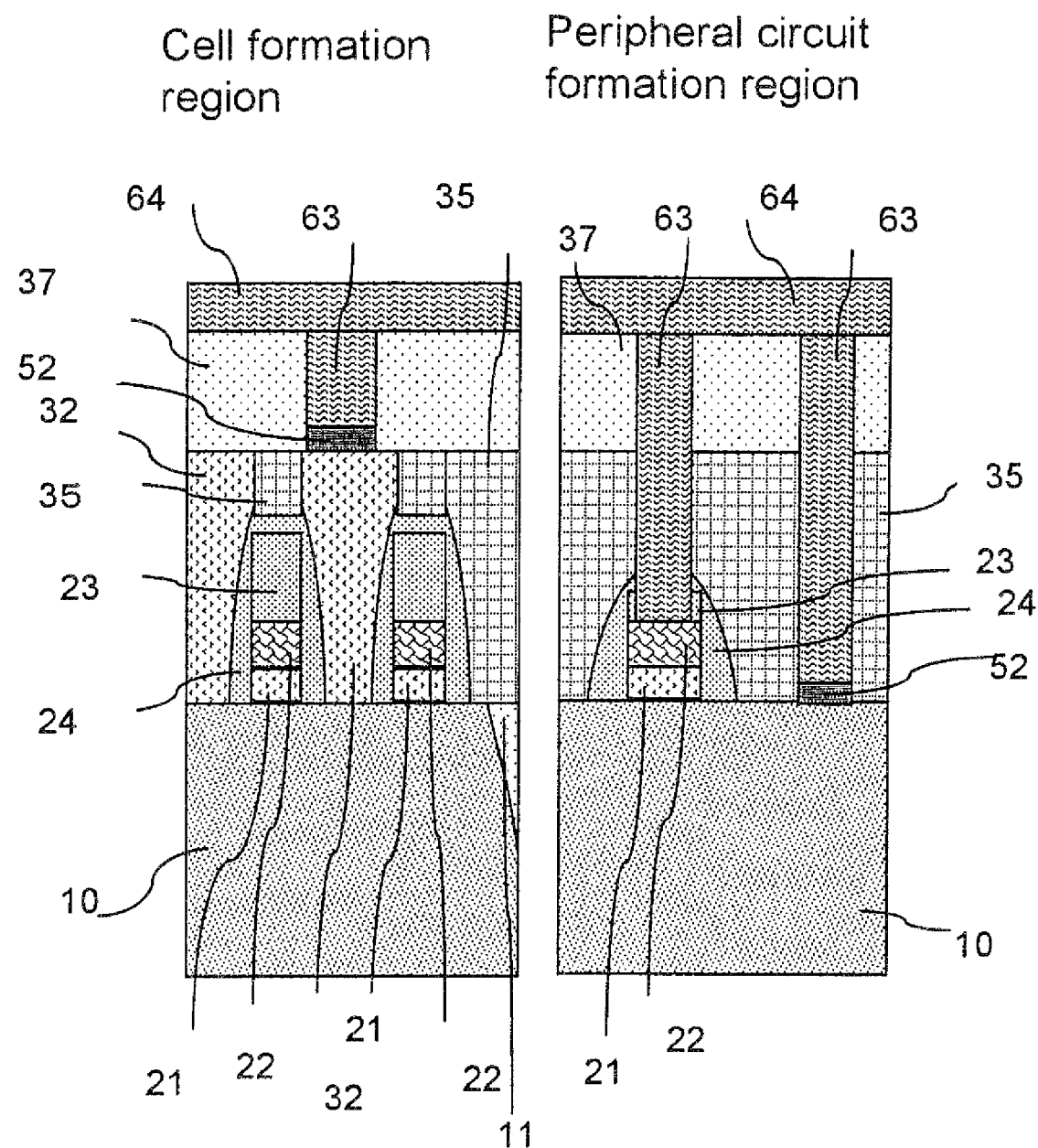
FIG. 6 is a cross-sectional view showing a state in which a contact has been formed in each of the openings in the structure of FIG. 5.

Subsequently, a metal film (tungsten) intended to be a contact plug is formed by CVD process in the holes shown in FIG. 10. Any excessive tungsten is polished off by CMP process, and then a metal film (tungsten) intended to be wiring is formed. A resulting structure will be the same as that of FIG. 6, which is described with the related art. Thus, sharing FIG. 6 in common in the exemplary embodiment, contact plugs 63 are formed in the first opening 41, the second opening 43 and the third opening 42 as shown in FIG. 6. A metal film 64 is formed on the entire surface of the structure. The metal film 64 is then patterned to form wiring, and formation of a cell storage capacitor and so on is performed.

The exemplary embodiment has been described above and illustrated in FIG. 9, using an example in which a cobalt film is formed, the cobalt is silicidized by heat treatment in the surface region where the silicon is exposed, and then any unreacted cobalt is removed by using a chemical solution principally composed of sulfuric acid and not containing any oxidizing agent such as hydrogen peroxide. However, the present invention is also applicable to a case in which prevention of oxidation of the cobalt film is performed. In this case, a titanium nitride film or the like may be superposed on the cobalt film as a cobalt oxidation preventing film, the cobalt is silicidized by heat treatment, and any reacted cobalt is then removed.

In this case, after the silicidization, a chemical solution capable of dissolving the cobalt oxidation preventing film such as APM is used to remove the same. Even if APM is used to remove the oxidation preventing film, the APM will not dissolve the tungsten of the gate since the removal of unreacted cobalt has not been performed yet and the tungsten is still covered with the cobalt. Subsequently, a chemical solution dissolving cobalt but not tungsten is used in the final step, whereby the unreacted cobalt can be removed without dissolving the metal wiring of the polymetal gate.

In this case as well, the openings are formed simultaneously in a single lithography process, and a cobalt film is formed to follow the shape of these openings. Another oxidation preventing metal material is formed on the cobalt and silicidized. Thereafter, a step of removing the oxidation preventing film and a step of removing the cobalt are performed separately using two types of chemical solution, one for removing the metal material of the oxidation preventing film and the other for removing cobalt. In this manner, the lithography steps can be reduced to a single step.

While the invention has been particularly shown and described with reference to exemplary embodiments thereof, the invention is not limited to these embodiments. It will be understood by those of ordinary skill in the art that various changes in form and details may be made therein without departing from the sprit and scope of the present invention as defined by the claims.

What is claimed is:

1. A manufacturing method of a semiconductor device having a silicide film, comprising at least:
    a first step of forming a first structure having a first opening formed through an interlayer insulating film to reach a contact plug, a second opening formed through the interlayer insulating film to reach a semiconductor substrate, and a third opening formed through the interlayer insulating film to reach a polymetal gate electrode;
    a second step of depositing a cobalt (Co) layer on the surface of the first structure;
    a third step of performing heat treatment to form a cobalt silicide layer on the surface of the contact plug and on the surface of the semiconductor substrate; and
    a fourth step of removing unreacted cobalt (Co) from said third opening and exposing the surface of said polymetal gate electrode with the use of a chemical solution capable of dissolving cobalt (Co) but not the polymetal.

2. The manufacturing method of a semiconductor device according to claim 1, wherein a metal film for preventing oxidation of cobalt (Co) is formed on the cobalt (Co) layer subsequent to the second step, and, after performing the third step, the metal film is removed by treating with a chemical solution prior to the fourth step.

3. The manufacturing method of a semiconductor device according to claim 1, wherein the surface of the gate electrode is formed of tungsten (W).

4. The manufacturing method of a semiconductor device according to claim 1, wherein the chemical solution capable of dissolving cobalt (Co) is a chemical solution having no oxidation effect on the surface of the gate electrode.

5. The manufacturing method of a semiconductor device according to claim 1, wherein the chemical solution for dissolving cobalt is a mixed solution of sulfuric acid and water.

6. The manufacturing method of a semiconductor device according to claim 1, wherein the chemical solution for dissolving cobalt is a mixed solution of hydrochloric acid and water.

7. A manufacturing method of a semiconductor device, comprising:
    forming a plurality of openings through an interlayer insulating film, the openings exposing surfaces of different conductive materials;
    depositing a cobalt layer on each of the exposed surfaces;
    performing a heat treatment to form a cobalt silicide layer on a first group of the exposed surfaces; and
    removing unreacted cobalt from a second group of the exposed surfaces using a chemical solution capable of dissolving cobalt to re-expose the second group of the exposed surfaces,
    wherein the first group of the exposed surfaces includes a silicon substrate and a polysilicon plug.

8. The manufacturing method according to claim 7, wherein the second group of the exposed surfaces includes tungsten.

9. The manufacturing method according to claim 7, wherein the chemical solution capable of dissolving cobalt is a chemical solution having no oxidation effect on the second group of the exposed surfaces.

10. The manufacturing method according to claim 7, wherein the chemical solution for dissolving cobalt is a mixed solution of sulfuric acid and water.

11. The manufacturing method according to claim 7, wherein the chemical solution for dissolving cobalt is a mixed solution of hydrochloric acid and water.

12. The manufacturing method according to claim 7, wherein the polysilicon plug contacts the silicon substrate.

* * * * *